United States Patent
Hurkx et al.

(10) Patent No.: US 6,462,377 B2
(45) Date of Patent: Oct. 8, 2002

(54) INSULATED GATE FIELD EFFECT DEVICE

(75) Inventors: Godefridus A. M. Hurkx, Best; Rob van Dalen, Eindhoven, both of (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/781,497

(22) Filed: Feb. 12, 2001

(65) Prior Publication Data

US 2001/0015433 A1 Aug. 23, 2001

(30) Foreign Application Priority Data

Feb. 12, 2000 (GB) .............................................. 0003185

(51) Int. Cl.[7] .............................................. H01L 29/76
(52) U.S. Cl. ..................... 257/339; 257/341; 257/488; 257/489
(58) Field of Search ................................ 257/339, 341, 257/488, 489, 491

(56) References Cited

U.S. PATENT DOCUMENTS

| 4,270,137 A | * | 5/1981 | Coe | ............................. | 257/339 |
| 4,754,310 A |   | 6/1988 | Coe | ............................. | 357/13 |
| 6,291,856 B1 | * | 9/2001 | Miyasaka et al. | ........... | 257/335 |

FOREIGN PATENT DOCUMENTS

| DE | 19848828 A |   | 4/2000 | ............ | H01L/29/06 |
| JP | 62-98777 | * | 5/1987 | ................ | 257/339 |
| WO | WO0068997 |   | 11/2000 | ............ | H01L/29/00 |

* cited by examiner

Primary Examiner—Mark V. Prenty
(74) Attorney, Agent, or Firm—Steven R. Biren

(57) ABSTRACT

A semiconductor body (10) has first and second opposed major surfaces (10a and 10b), with a first region (11) of one conductivity type and a plurality of body regions (32) of the opposite conductivity type each forming a pn junction with the first region (11). A plurality of source regions (33) meet the first major surface (10a) and are each associated with a corresponding body region (32) such that a conduction channel accommodating portion (33a) is defined between each source region (33) and the corresponding body region (32). An insulated gate structure (30,31) adjoins each conduction channel area (33a) for controlling formation of a conduction channel in the conduction channel areas to control majority charge carrier flow from the source regions (33) through the first region (11) to a further region (14) adjoining the second major surface (10b). A plurality of field shaping regions (20) are dispersed within the first region (11) and extend from the source regions (33) towards the further region (14) such that, in use, a voltage is applied between the source and further regions (33 and 14) and the device is non-conducting, the field shaping regions (20) provide a path for charge carriers from the source regions at least partially through the first region and cause a depletion region in the first region (11) to extend through the first region (11) towards the further region (14) to increase the reverse breakdown voltage of the device.

11 Claims, 2 Drawing Sheets

US 6,462,377 B2

1

INSULATED GATE FIELD EFFECT DEVICE

BACKGROUND OF THE INVENTION

This invention relates to an insulated gate field effect device, especially a vertical insulated gate field effect device capable of withstanding high reverse voltages when non-conducting.

It is well known in the semiconductor art that the reverse voltage withstanding capability of a vertical insulated gate field effect device can be increased by reducing the dopant concentration and increasing the size of the drain drift region. However, this also increases the resistivity and length of the majority charge carrier path through the device when the device is conducting. This means that the series resistivity of the current path for majority charge carriers through the device, and thus the on-resistance of the insulated gate field effect device, increases in proportion to approximately the square of the desired reverse breakdown voltage.

U.S. Pat. No. 4,754,310 (our reference PHB32740) addresses this problem by providing the drain drift region as a zone formed of first regions of one conductivity type interposed with second regions of the opposite conductivity type with the dopant concentrations and dimensions of the first and second regions being such that, when the device is reversed biased in operation and the zone is depleted of free charge carriers, the space charge per unit area in the first and second regions balances at least to the extent that the electric field resulting from the space charge is less than the critical field strength at which avalanche breakdown would occur. This enables the required reverse breakdown voltage characteristics to be obtained using interposed semiconductor regions which individually have a higher dopant concentration, and thus lower resistivity, than would otherwise be required so that the series resistivity of the first and second regions and thus the on-resistance of the device can be lower than for conventional devices.

SUMMARY OF THE INVENTION

It is an aim of the present invention to provide another way of improving the trade off between breakdown voltage and on resistance in vertical high voltage insulated gate field effect devices where the word "vertical" should be understood to mean that the main current flow path through the device is between first and second main opposed surfaces of the device.

According to one aspect of the present invention there is provided a vertical insulated field effect device, such as a MOSFET, wherein the drain drift region has dispersed therein a plurality of semi-insulative regions extending substantially in the direction of the main majority charge carrier path through the drain drift region, the semi-insulative regions adjoining source regions of the device to provide a current leakage path from the source regions through the drain drift region to cause, when the device is non-conducting and a voltage is applied between its main electrodes in use, the depletion region within the drain drift region to spread to a greater extent than it would have done without the presence of the semi-insulative regions.

According to one aspect of the present invention there is provided a vertical insulated field effect device, such as a MOSFET, wherein a drain drift region has dispersed therein a plurality of semi-insulative or resistive paths extending substantially in the direction of the main majority charge carrier path through the drain drift region and electrically coupled to source regions of the MOSFET so as to provide

2 current leakage paths from the source regions to cause, when the device is non-conducting and a voltage is applied between its main electrodes in use, the depletion region within the drain drift region to spread to a greater extent than it would have done without the presence of the paths.

According to an aspect of the present invention, there is provided an insulated gate field effect device as set out in claim 1.

The present invention thus enables an insulated gate field effect device to be provided which enables the trade off between reverse breakdown voltage and on resistance to be improved in a manner that is different from that proposed in U.S. Pat. No. 4,754,310 and that may, at least in certain circumstances, be simpler and/or more economical to manufacture.

Other advantageous technical features in accordance with the present invention are set out in the appended dependent claims.

BRIEF DESCRIPTION OF THE DRAWING

Embodiments of the present invention will now be described, by way of example, with reference to the accompanying diagrammatic drawings, in which.

It should be noted that (with the exception of FIG. 3) the Figures are diagrammatic, relative dimensions and proportions of parts having been shown exaggerated or reduced in size for the sake of clarity and convenience. The same reference signs are generally used to refer to corresponding or similar features.

Figure 1:
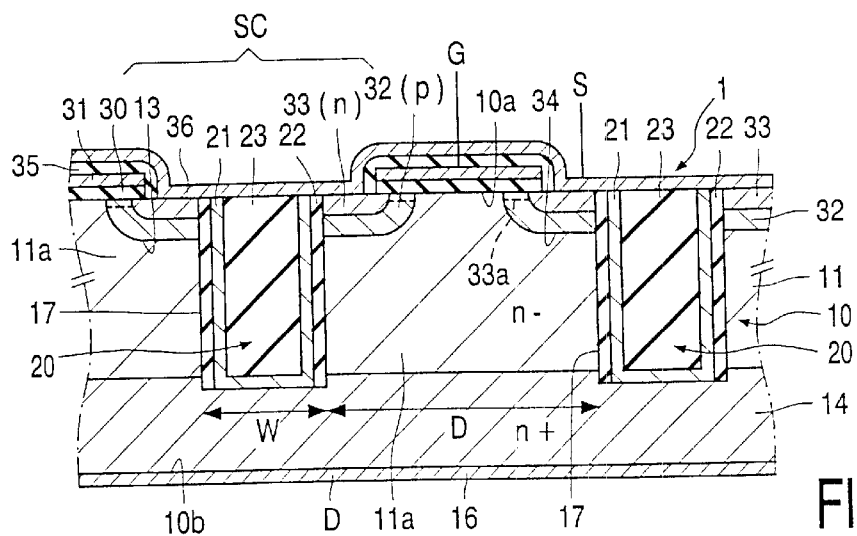
FIG. 1 shows a diagrammatic cross-sectional view through part of an embodiment of an insulated gate field effect semiconductor device in accordance with the present invention.

Referring now to FIG. 1, this shows an insulated gate field effect semiconductor device 1 in the form of a MOSFET. The MOSFET 1 comprises a monocrystalline silicon semiconductor body 10 having first and second opposed major surfaces 10a and 10b. The semiconductor body 10 comprises a relatively highly doped substrate 14 of one conductivity type, n+conductivity type in this example, which forms the drain region of the MOSFET. A relatively lowly doped semiconductor region 11 of the one conductivity type, (n−) conductivity type in this example, forms a drain drift region of the MOSFET. Typically, the dopant concentration within the semiconductor first region 11 is $2 \times 10^{15}$ atom $cm^{-3}$.

An insulated gate structure G consisting of a gate dielectric layer 30 and a gate conductive layer 31 is provided on the first major surface 10a. As is known in the art, the insulated gate structure G, when viewed in plan looking down on the surface 10a, defines a regular mesh or grid having openings in each of which is formed a source cell SC consisting of a body region 32 of the opposite conductivity type (p conductivity type in this example) forming a pn junction 34 with the drain drift region 11 and containing a source region 33 of the one conductivity type (n conductivity type in this example) so that part of the body region 32 defines with the source region 33 a conduction channel region 33a under the insulated gate structure G through which a conduction channel is controlled by means of a voltage applied to the insulated gate structure G.

An insulating region 35 is provided over the gate structure G. Source metallisation 36 contacting all of the source regions 33 is provided on the first major surface 10a over the insulating region 35 to provide a source electrode S. Although not shown, electrical connection to the insulated gate structure G is provided by formation of one or more windows through the insulating region 35 to expose part of the gate conductive layer 31 and patterning of the source metallisation to provide a separate gate electrode. A metallisation layer 16 forms an ohmic contact with the drain region 14 so as to provide a drain electrode D.

DESCRIPTION OF THE PREFERRED EMBODIMENTS

Although FIG. 1 shows only one complete source cell SC, in practice the MOSFET 1 will consist of many thousands of parallel connected source cells sharing the common drain region 14. The MOSFET 1 is a vertical MOSFET, that is a MOSFET in which the main current path from the source regions 33 to the drain region 14 is in a direction perpendicular to the first and second major surfaces 10a and 10b.

The structure of the MOSFET 1 described so far forms a conventional vertical DMOSFET. However, in contrast to a conventional DMOSFET, the MOSFET 1 has a plurality of electric field shaping regions 20 distributed throughout the drain drift region 11 such that each source cell SC is associated with an electric field shaping region 20 which extends from the source electrode 36 through the body region 32 of the source cell SC through the drain drift region 11 towards the drain region 14. In the example shown, the field relief regions 20 extend slightly into the drain region 14.

The field relief regions 20 act to provide current leakage paths from the source electrode S into the drain drift region 11 towards (as shown into) the drain region when a voltage is applied between the source and drain electrodes S and D but the MOSFET 1 is non-conducting. When the MOSFET 1 is conducting, these paths will simply add a small source-drain current parallel to the main source-drain current path through the drain drift region 11.

In the embodiment shown in FIG. 1, each field shaping region comprises a layer 21 of semi-insulating or highly resistive material deposited in a corresponding opening 17 extending from the first major surface 10a through the source, body and drain drift regions 33,32 and 11 and just to or, as shown, into the drain region 14. The upper and lower limits for the resistivity will depend on the device characteristics with the lower limit being determined by the maximum acceptable leakage current and the upper limit being determined by the required switching and ruggedness characteristics.

The resistive or semi-insulating layer 21 may be, for example, a layer of polycrystalline silicon doped with oxygen and/or nitrogen so as to have a resistivity in the range of, typically, from about $10^7$ to about $10^9$ ohm cm or may be a layer of silicon nitride having a resistivity in the same range. The semi-insulating layers 21 are separated from the walls of the openings 17 by respective layers 22 of an insulating material, typically silicon dioxide. Typically, the semi-insulating layers 21 will have a thickness of 0.5 $\mu$m (micrometers) while the insulating layer 22 will have a thickness of, typically, 30 nm (nanometers). To provide a planar first major surface 10a for the subsequent metallisation, the openings 17 are filled with a filler material 23 such as TEOS (Tetraethylorthosilicate).

Typically, the drain drift region 11 will have a thickness of 40:m and, when viewed in plan looking down on the first major surface 10a, the openings 17 may, but need not necessarily, have the same geometry as the source cells SC, for example square, hexagonal, stripe or circular. In an embodiment, where the insulated gate structure G defines a square grid, the openings 17 are square when viewed looking down on the first major surface 10a. The pitch of the openings 17 will correspond to the pitch of the source cells SC and, although not shown as such, the width W of each opening 17 will be the same as or similar to the distance D between adjacent openings 17. For example W and D may lie in the range of from 5 to 10 micrometers. The product of the dopant concentration [n] and the width D of the areas 11a of the drain drift region 11 bounded by the openings 17 should, as set out in U.S. Pat. No. 4,754,310, be $2\times10^{12}$ atoms cm$^{-2}$ and both D and W should be as small as possible for the lowest on resistance (Rdson). Although only one field shaping region 20 per source cell is shown there may be two or more.

Figure 2:
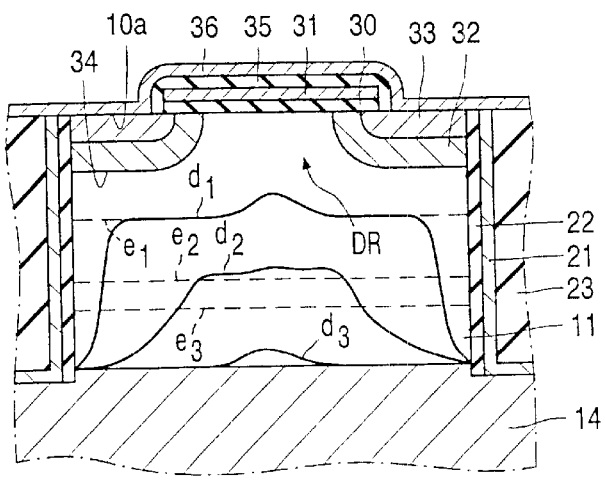
FIG. 2 shows part of the device of FIG. 1 on an enlarged scale to illustrate operation of the device when the device is non-conducting and a voltage is applied between its main electrodes.

FIG. 2 shows part of the MOSFET on an enlarged scale to illustrate the effect of providing the field shaping regions 20 or resistive paths. For the sake of this illustration, the drain drift region 11 is shown unhatched. When the pn junction 34 is reversed bias in operation by a voltage applied between the main electrodes S and D and the MOSFET 1 is non-conducting, that is there is no conduction channel formed in the conduction channel region 33a, a small leakage current flows along each of the resistive paths 21 causing a linear electrical potential drop along the resistive paths 21 so that the vertical electrical field near the interface between the insulating layer 22 and the first region 11 is substantially constant. FIG. 2 illustrates the change in the extent of the depletion region DR within the drain drift region 11 with increasing reverse biasing voltage across the pn junctions 34, that is with increasing source-drain voltage. The solid lines d1 to d3 illustrate the extent of the depletion region DR and the dashed lines e1 to e3 illustrate what the extent of the depletion region would have been in the absence of the resistive paths 21. As shown by the lines d1 and e1, at a relatively low reverse biasing voltage, the resistive paths 21 cause the depletion region DR to extend towards the drain region 14. As the reverse biasing voltage is increased and thus the electrical potential difference along the resistive paths 21 increases, the portions of the depletion regions adjacent to the resistive paths 21 expand until, as shown by the line d3 the depletion regions merge so that the drain drift region 11 is substantially entirely depleted of free charge carriers. If the pitch between adjacent resistive paths 21 is sufficiently small, typically 5 to 10 micrometers for a dopant concentration in the drain drift region of $2-4\times10^{15}$ atoms cm$^{-3}$, the vertical electrical field will be nearly constant everywhere before the critical field for avalanche breakdown is reached in the drain drift region 11 so allowing the same reverse breakdown voltage characteristics to be achieved with a much higher dopant concentration in the drain drift region 11 than would be the case if the field shaping regions 20 were omitted. Where a 800 volt MOSFET is required, that is a MOSFET with an 800 volt reverse breakdown voltage, then in the absence of the field shaping regions a dopant concentration of $3\times10^{14}$ cm$^{-3}$ would be required for the drain drift region with the other dimensions (such as the thickness of the drain drift region) being as set out above. In contrast, where the field shaping regions are provided as in the invention, and D=10 µm, then the drain drift region can have a dopant concentration N of $2\times10^{15}$ cm$^{-3}$ enabling a lower on-resistance.

Figure 3:
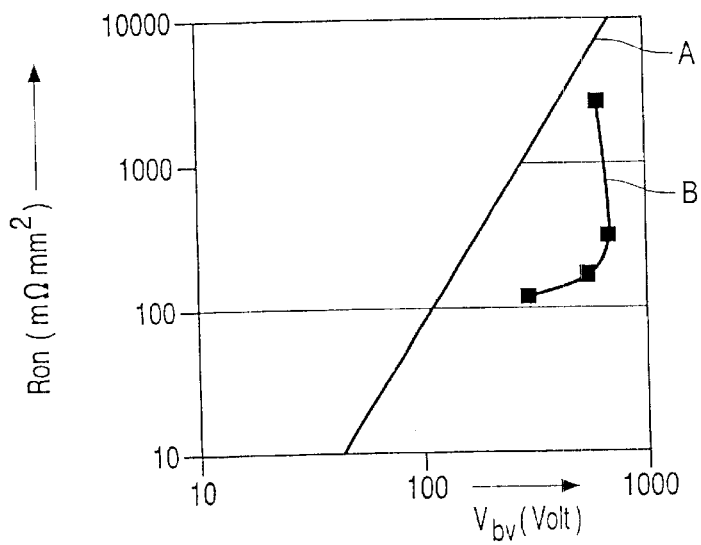
FIG. 3 shows a graph of on-resistance (Ron) against reverse breakdown voltage (Vbv) to illustrate the effect of the present invention.
Figure 4:
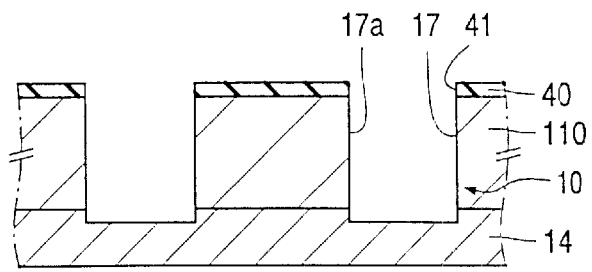
FIGS. 4 to 8 illustrates steps in one example of a method that may be used in manufacturing the insulated gate field effect device shown in FIG. 1.

FIG. 3 shows a graph of on-resistance (Ron) in milli-Ohms per millimeter squared against reverse breakdown voltage (Vbv) in volts. In FIG. 3 the line A shows the theoretical silicon 1D limit while line B shows the limit that can be achieved by a silicon MOSFET in accordance with the present invention with a pitch (W or D in FIG. 1) of 4 micrometers and a drain drift region 11 thickness of 30 micrometers. At least for certain combinations of drain drift region thickness and required reverse breakdown voltage, the present invention enables an improved trade off between on-resistance and breakdown voltage to be achieved which is similar to that which can be achieved using the invention disclosed in U.S. Pat. No. 4,754,310 without the need for the precise charge balancing required in U.S. Pat. No. 4754310.

FIGS. 4 to 8 illustrate cross-sectional views of part of a semiconductor body to illustrate steps in one method of manufacturing a MOSFET 1 as shown in FIG. 1. Initially a semiconductor body 10 is provided consisting of a n+conductivity type substrate for forming the drain region 14. An n-conductivity type epitaxial layer 110 is grown on the substrate 14 for forming the drain drift region 11. A masking layer 40 (for example a silicon dioxide, silicon nitride or resist layer) is provided on the surface of the epitaxial layer 110 and patterned using conventional photolithographic techniques to define windows 41 in the masking layer 30. An anisotropic etching process is then carried out as is known in the art to define the openings 17 extending through the epitaxial layer 110 into the substrate 14 to produce the structure shown in FIG. 4.

Figure 5:
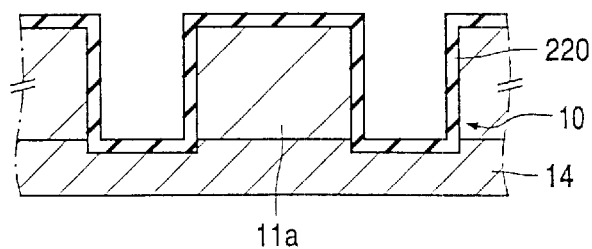
Figure 6:
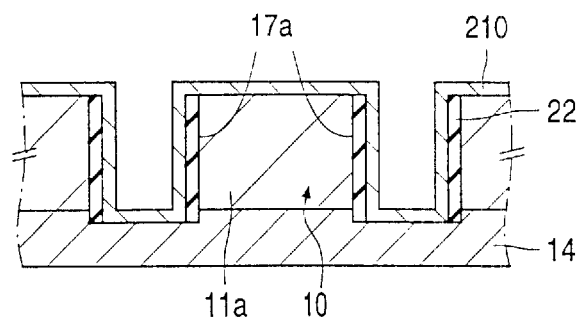
Figure 7:
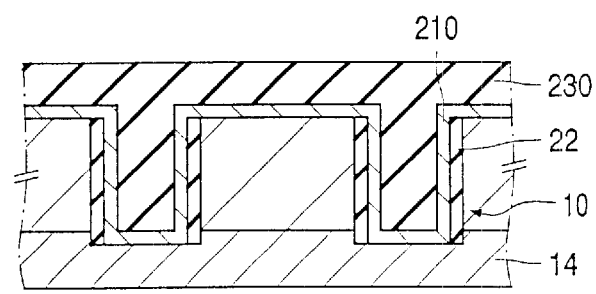
Figure 8:
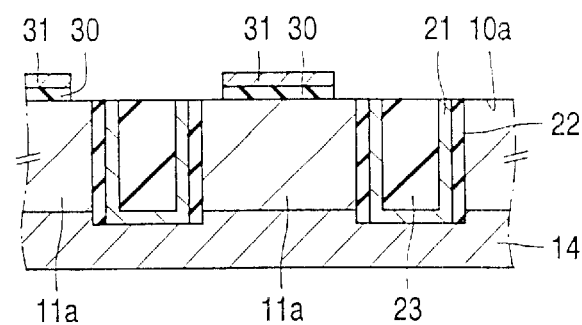

The masking layer 40 is then removed using conventional masking layer removal techniques and, after cleaning of the exposed surface, a thermal oxide layer 220 is grown on the exposed silicon surface as shown in FIG. 5. The thermal oxide layer 220 is then subjected to an anisotropic etching process to leave the oxide only on the side walls 17a of the openings 17 (see FIG. 6) so as to form the insulating layers 22. A layer 210 of semi-insulating or resistive material, in this case oxygen doped polycrystalline silicon or semi-insulating silicon nitride, is then deposited using known chemical vapour deposition techniques. A filler material such as, for example, TEOS is then deposited over the semi-insulating layer 210 to form a layer 230 having a relatively planar exposed surface. The layers 230 and 210 are then etched back using a conventional etching technique which etches the material of the layer 230 at the same rate as the material of the layer 210 to produce a planar surface as shown in FIG. 8.

A gate dielectric layer is then thermally grown on the first major surface 10a and a doped polycrystalline silicon layer is deposited onto the gate dielectric layer. These two layers are patterned using known photolithographic and etching techniques so as to define the insulated gate structure 30,31 as shown in FIG. 8. Then, as is known in the art, p-conductivity type impurities are introduced into the first major surface 10a using the insulated gate structure 30,31 as a mask followed by n-conductivity type impurities so that, after diffusion during subsequent processing, the p-body and source regions 32 and 33 shown in FIG. 1 are formed so as to be aligned with the insulated gate structure 30,31. A dielectric layer is then provided over the surface structure and patterned using known masking and etching techniques to define the insulating region 35. Although not shown, a window or windows are formed in the insulating region 35 to enable metallisation to contact the gate conductive layer 31 and then metallisation is deposited and patterned to define the source metallisation 36 and the gate metallisation (not shown in FIG. 1).

As is known in the art, to inhibit parasitic bipolar action, parts of the first major surface 10a within the windows defined by the insulated gate structure 30,31 may be masked from the introduction of the source impurities and may have a higher concentration of p-type impurities so that the source metallisation 36 when deposited electrically shorts the body regions 32 to the source regions 33 to inhibit parasitic bipolar action.

In the MOSFET described above, the resistive paths 21 are separated from the drain drift region 11 by the insulating layers 22. The thickness of the insulating layer 22 is determining by the required ruggedness and speed of the MOSFET and therefore depends upon the magnitude of the electric field within the MOSFET during switching transients. Typically the insulating layer 22 may have a thickness of 30 nm. The insulating layers 22 serve to achieve a linear potential drop or difference along the resistive paths 21 by inhibiting or at least reducing the possibility of conduction between the resistive paths 21 and the drain drift region 11. However, the resistive paths 21 will still serve to increase the spread of the depletion region towards the drain region 14 even in the absence of the insulating layers 21 and, although the electrical potential along the resistive paths will be less linear without the insulating layers 22, the effects of the present invention may be achieved without the insulating layers, especially where the resistive paths 21 comprise oxygen doped polycrystalline silicon (SIPOS). In addition, the field shaping regions 20 need not necessarily extend entirely through the drain drift region, although they should extend to at least some distance below the p-body regions 32.

The filler material 23 is provided to enable a substantially planar surface to be provided onto which the insulated gate structure and subsequent metallisation can be deposited. Where such a planar surface is not essential, then it may be possible to omit the filler material. Also, the relative dimensions of the openings 17 and the thicknesses of the resistive paths 21 may be such that the material of the resistive paths 21 substantially fills the opening 17 so that there is no need for any filler material. Having wider openings 17 makes it easier to deposit material into the openings, however having narrower openings is advantageous because it should enable a higher packing density for the source cells SC. Also, where the openings 17 are sufficiently narrow, semi-insulating material providing the resistive paths may substantially fill the openings 17 so that there is no need for a filler material.

In the above described examples the source regions are semiconductor regions. However, the source regions could be provided by Schottky metallisation such as silicide, for example platinum silicide, forming a Schottky barrier with the body regions. Also, in the above described examples, the insulated gate field effect device is a MOSFET with the substrate 14 being of the same conductivity type as the drain drift region. However, the present invention may be applied to an IGBT (insulated gate bipolar transistor) by forming the substrate of opposite conductivity type (p-conductivity type in the examples given above) to the drain drift region. Also, the insulated gate field effect device described above is a normally off or enhancement mode device. However, by appropriate doping of the conduction channel region 33a, the device may be a normally on or depletion mode device.

It will, of course, be appreciated that the present invention may also be applied where the conductivity types given above are reversed and that semiconductor materials other than silicon may be used such as germanium or germanium silicon alloys.

The present invention may also be applied to Trenchfets with breakdown voltages of about 500 volts or greater.

In the above described embodiments, the insulated gate structure has a grid-like or mesh structure and the openings 17 are discrete openings. However, the situation may be reversed so that openings 17 form a continuous trench having a grid-like structure and the resistive paths are therefore connected together to form a resistive grid-like region.

In the above described examples, the resistive paths are provided by a semi-insulating material such as oxygen and/or nitrogen doped polycrystalline silicon or silicon nitride. However other materials providing resistivities similar to those given above may be used with the actual resistivity being selected to enable the desired leakage current, switching and ruggedness characteristics to be achieved.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during the prosecution of the present application or of any further application derived therefrom.

What is claimed is:

1. An insulated gate field effect device comprising a semiconductor body having first and second opposed major surfaces, the semiconductor body comprising a first region of one conductivity type and a plurality of body regions of the opposite conductivity type each forming a pn junction with the first region, the device having a plurality of source regions meeting the first major surface and each associated with a corresponding body region such that a conduction channel accommodating portion is defined between each source region and the corresponding body region, and an insulated gate structure adjoining each conduction channel area for controlling formation of a conduction channel in the conduction channel areas to control majority charge carrier flow from the source regions through the first region to a further region adjoining the second major surface, characterised in that a plurality of field shaping regions are dispersed within the first region and extend from the first major surface towards the further region such that, in use, when a voltage is applied between the source and further regions and the device is non-conducting, the field shaping regions provide a path for charge carriers from the source regions and at least partially through the first region to cause a depletion region in the first region to extend through the first region towards the further region to increase the reverse breakdown voltage of the device.

2. A device according to claim 1, wherein each source region is associated with a single field shaping region.

3. A device according to claim 1, wherein the field shaping regions comprise semi-insulating paths each having one end electrically coupled to a source region.

4. A device according to claim 3, wherein each semi-insulating path formed as a layer on a surface of a corresponding opening extending rough the first region towards the further region.

5. A device according to claim 4, wherein the opening is filled by a filler material provided on the semi-insulating layer.

6. A device according to claim 3, wherein each semi-insulating path is separated from the first region by an insulating region.

7. A device according to claim 3, wherein the semi-insulating paths comprise at least one of oxygen doped polycrystalline silicon and silicon nitride.

8. A device according to claim 1, wherein at least some of the field shaping regions provide a path for charge carriers extending completely through the first region and into the further region.

9. A device according to claim 1, wherein the further region is a semiconductor region of the same conductivity type but more highly doped than the first region.

10. A device according to claim 1, wherein the further region is a semiconductor region of the opposite conductivity type to and more highly doped than the first region.

11. A device according to claim 1, wherein the source regions are semiconductor regions of the same conductivity type as the first region.

* * * * *